(12) United States Patent
Fumitake et al.

(10) Patent No.: US 9,362,286 B2
(45) Date of Patent: Jun. 7, 2016

(54) FIN FIELD EFFECT TRANSISTOR AND METHOD FOR FORMING THE SAME

(71) Applicant: Semiconductor Manufacturing International (Shanghai) Corporation, Shanghai (CN)

(72) Inventors: Mieno Fumitake, Shanghai (CN); Jianhua Ju, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/574,639

(22) Filed: Dec. 18, 2014

(65) Prior Publication Data
US 2015/0171085 A1 Jun. 18, 2015

(30) Foreign Application Priority Data
Dec. 18, 2013 (CN) .......................... 2013 1 0698747

(51) Int. Cl.
| | |
|---|---|
| *H01L 21/02* | (2006.01) |
| *H01L 21/70* | (2006.01) |
| *H01L 21/8238* | (2006.01) |
| *H01L 21/336* | (2006.01) |
| *H01L 27/092* | (2006.01) |
| *H01L 29/78* | (2006.01) |

(52) U.S. Cl.
CPC .... *H01L 27/0924* (2013.01); *H01L 21/823807* (2013.01); *H01L 21/823814* (2013.01); *H01L 21/823821* (2013.01); *H01L 29/7853* (2013.01); *H01L 21/0262* (2013.01); *H01L 21/02529* (2013.01); *H01L 21/02636* (2013.01)

(58) Field of Classification Search
CPC ................... H01L 27/0924; H01L 21/823814; H01L 21/823821; H01L 29/7853; H01L 29/66795
USPC .................. 257/369, 190, E21.431, E21.634; 438/199, 300
See application file for complete search history.

(56) References Cited

U.S. PATENT DOCUMENTS

| | | | |
|---|---|---|---|
| 5,719,416 A * | 2/1998 | Yoshimori et al. ............ | 257/295 |
| 2006/0097393 A1* | 5/2006 | Uchimaru et al. ............ | 257/758 |
| 2011/0079829 A1* | 4/2011 | Lai et al. ........................ | 257/288 |
| 2011/0201164 A1* | 8/2011 | Chung et al. .................. | 438/229 |
| 2011/0278676 A1* | 11/2011 | Cheng et al. .................. | 257/369 |
| 2012/0153398 A1* | 6/2012 | Baars et al. .................... | 257/369 |

OTHER PUBLICATIONS

Yuichiro Sasaki, An De Keersgieter, Chew Soon Aik, Thomas Chiarella, Geert Hellings, Mitsuhiro Togo, Gerd Zschatzsch, Aaron Thean and Naoto Horiguchi Optimization of standard As ion implantation for NMOS Si bulk FinFETs extension Ext. Abs. The 13th International Workshop on Junction Technology 2013.

\* cited by examiner

*Primary Examiner* — Fernando L Toledo
*Assistant Examiner* — Aaron Gray
(74) *Attorney, Agent, or Firm* — Anova Law Group, PLLC

(57) ABSTRACT

Various embodiments provide semiconductor devices and methods for forming the same. A first fin and a second fin are formed on a semiconductor substrate. A first dielectric layer is formed on the semiconductor substrate and has a top surface lower than a top surface of both of the first fin and the second fin. A gate structure is formed on the first dielectric layer and covering across a first portion of each of the first fin and the second fin. A second portion of the first fin on both sides of the gate structure is removed, forming a first recess. A first semiconductor layer is formed in the first recess. A second dielectric layer is formed on the first dielectric layer and the first semiconductor layer, and exposes a top surface of the second fin. A second semiconductor layer is formed on the exposed top surface of the second fin.

18 Claims, 8 Drawing Sheets

FIN FIELD EFFECT TRANSISTOR AND METHOD FOR FORMING THE SAME

CROSS-REFERENCES TO RELATED APPLICATIONS

This application claims priority to Chinese Patent Application No. CN201310698747.4, filed on Dec. 18, 2013, the entire content of which is incorporated herein by reference.

FIELD OF THE DISCLOSURE

The present disclosure relates to the field of semiconductor technology and, more particularly, relates to fin field effect transistors and methods for forming the same.

BACKGROUND

With continuous development of semiconductor processing technology, process node is gradually decreased. Gate-last process has been widely applied, in order to achieve desired threshold voltage and improve device performance. However, when feature size (or critical dimension) of a device is further reduced, even when the gate-last process is applied, structure of a conventional metal-oxide-semiconductor field effect transistor (MOSFET) is no longer able to meet requirements for the device performance. As a type of multi-gate device, attention has been paid to fin field effect transistor (FinFET).

FIG. 1 depicts a three-dimensional schematic of a FinFET formed using conventional technology. As shown in FIG. 1, a FinFET includes a semiconductor substrate 10 that has a protruding fin 11 formed thereon. The fin 11 is generally obtained by etching the semiconductor substrate 10. The FinFET further includes a dielectric layer 12 that covers a surface of the semiconductor substrate 10 and a portion of sidewalls of the fin 11. The FinFET further includes a gate structure 13 that extends across the fin 11 to cover a portion of both of a top and sidewalls of the fin 11. The gate structure 13 includes a gate dielectric layer (not shown) and a gate electrode on the gate dielectric layer (not shown). For the FinFET, the portion of the top and both sidewalls of the fin 11 that is in contact with the gate structure 13 all becomes a channel region. That is, the FinFET has a plurality of gates, which can help to increase drive current and improve device performance.

Performance of the FinFET needs to be further improved. The disclosed methods and structures are directed to solve one or more problems set forth above and other problems.

BRIEF SUMMARY OF THE DISCLOSURE

One aspect of the present disclosure includes methods for forming a fin field effect transistor (FinFET). In an exemplary method, a semiconductor substrate having an NMOS region and a PMOS region can be provided. A first fin can be formed on the PMOS region, and a second fin can be formed on the NMOS region. A first dielectric layer can be formed on the semiconductor substrate. A top surface of the first dielectric layer can be lower than a top surface of both of the first fin and the second fin. A gate structure can be formed on the first dielectric layer and covering across a first portion of each of the first fin and the second fin. A second portion of the first fin on both sides of the gate structure can be removed, to form a first recess on the PMOS region. A first semiconductor layer can be formed in the first recess. A second dielectric layer can be formed on the first dielectric layer, the second fin and the first semiconductor layer. A portion of the second dielectric layer can be removed, to expose at least a top surface of the second fin. A second semiconductor layer can be formed at least on the exposed top surface of the second fin.

Another aspect of the present disclosure includes semiconductor devices. An exemplary device can include a semiconductor substrate having an NMOS region and a PMOS region. The device can include a first fin on the PMOS region of the semiconductor substrate and a second fin on the NMOS region of the semiconductor substrate. Further, the device can include a first dielectric layer on the semiconductor substrate. A surface of the first dielectric layer can be lower than a top surface of both of the first fin and the second fin. Further, the device can include a gate structure on the first dielectric layer and covering across the first fin and the second fin. The first fin can be substantially entirely covered by the gate structure. Further, the device can include a first semiconductor layer on the PMOS region of the semiconductor substrate at each side of the gate structure and in contact with the first fin underneath the gate structure. The first dielectric layer can be located at both sides of each of the first semiconductor layer and the second fin. Further, the device can include a second semiconductor layer on a top surface of a portion of the second fin exposed at the each side of the gate structure. Still further, the device can include a second dielectric layer on the first dielectric layer and substantially filling space between the first semiconductor layer, the first dielectric layer, and the second fin.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When ion implantation is performed on a source region and a drain region of a FinFET to form a source (or source electrode) and a drain (or drain electrode), a relatively significant amount of defects are likely to be formed in the source region and the drain region. In addition, because size of the fin of the FinFET is relatively small, performance of the formed FinFET is more likely to be affected.

In various disclosed embodiments, a source and a drain can be formed by an epitaxial process. Further, the source and the drain can be doped by using an in-situ doping process, to reduce defects in the source and the drain.

In certain embodiments, a source region can refer to a region that is, has been, or is to be doped or processed in any other appropriate way to form a source. Thus, before the source is formed, such a region can be referred to as a "source region". After the source is formed, such a region can be referred to as a "source region" or a "source".

In certain embodiments, a drain region can refer to a region that is, has been, or is to be doped or processed in any other appropriate way to form a drain. Thus, before the drain is formed, such a region can be referred to as a "drain region". After the drain is formed, such a region can be referred to as a "drain region" or a "drain".

Figure 14:
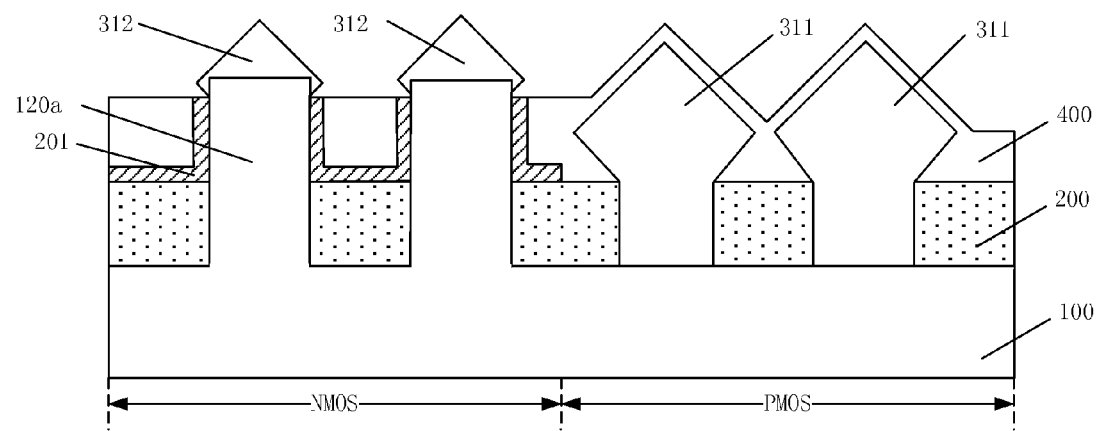
Figure 15:
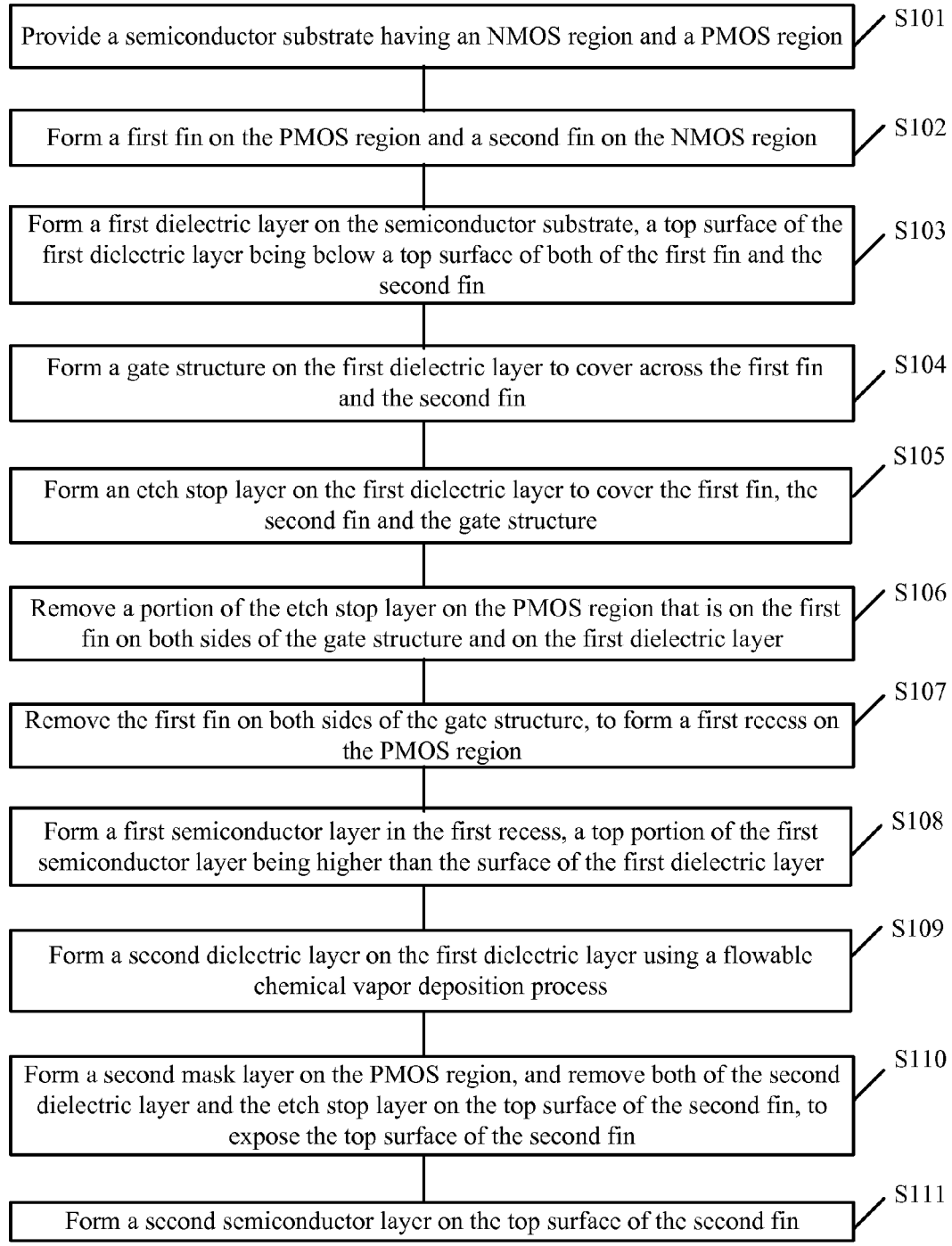
FIG. 15 depicts a flow diagram of an exemplary method for forming a FinFET in accordance with various disclosed embodiments.

FIG. 15 depicts a flow diagram of an exemplary method for forming a FinFET in accordance with various disclosed embodiments. FIGS. 2-14 depict structures of the FinFET at various stages during a fabrication process in accordance with various disclosed embodiments. Note that although FIGS. 2-14 depict semiconductor structures corresponding to the method depicted in FIG. 15, the semiconductor structures and the method are not limited to one another in any manner.

Figure 1:
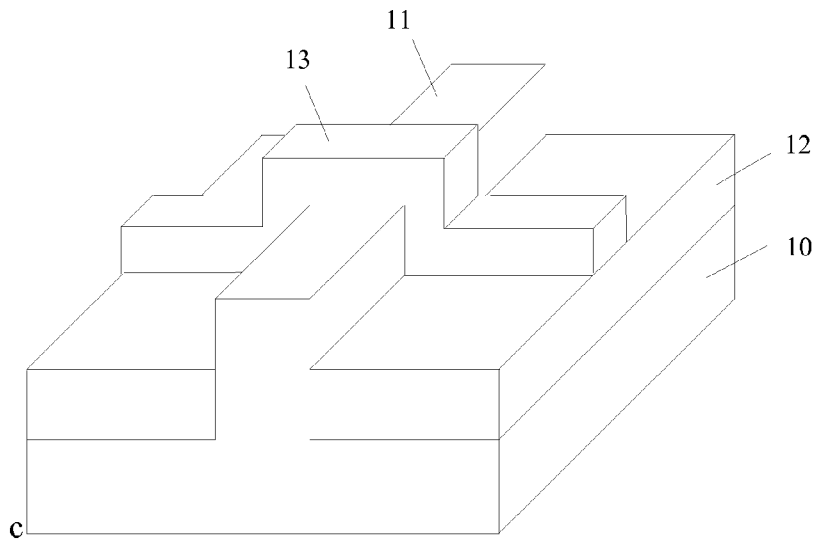
FIG. 1 depicts a schematic of a FinFET formed using conventional technology.
Figure 2:
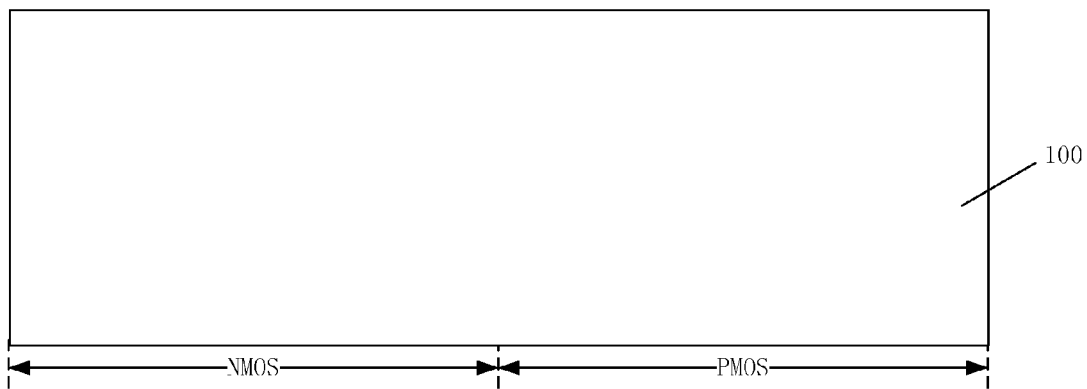
FIGS. 2-14 depict structures of an exemplary FinFET at various stages during a fabrication process in accordance with various disclosed embodiments.

In Step S101 of FIG. 15 and referring to FIG. 2, a semiconductor substrate 100 is provided. The semiconductor substrate 100 has an NMOS region and a PMOS region.

The semiconductor substrate 100 can be made of a material including silicon, germanium, silicon germanium, gallium arsenide and/or any other appropriate semiconductor materials. The semiconductor substrate 100 can be made of a bulk material, or can have a composite structure, e.g., silicon-on-insulator. Those skilled in the art can select the type of the semiconductor substrate 100 according to the semiconductor device formed on the semiconductor substrate 100. Therefore the type of the semiconductor substrate 100 should not limit the scope of the present disclosure.

The semiconductor substrate 100 can include an NMOS region and a PMOS region. The NMOS region can be used for forming an N-type FinFET. The PMOS region can be used for forming a P-type FinFET. A P-well can be formed in the NMOS region. An N-well can be formed in the PMOS region.

Figure 3:
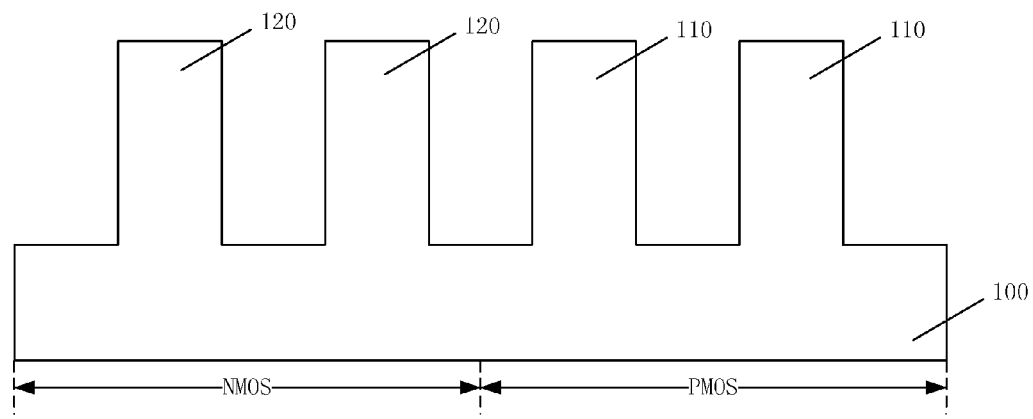

In Step S102 of FIG. 15 and referring to FIG. 3, one or more first fins 110 are formed on the PMOS region of the semiconductor substrate 100, and one or more second fins 120 are formed on the NMOS region of the semiconductor substrate 100.

In one embodiment, a patterned mask layer can be formed on a surface of the semiconductor substrate 100. The patterned mask layer can define a location and a size of the first fin 110 and the second fin 120. The semiconductor substrate 100 can be etched by using the patterned mask layer as an etch mask, to form the first fin 110 and the second fin 120.

In another embodiment, the first fin 110 and the second fin 120 can be formed by forming an epitaxial layer on the surface of the semiconductor substrate 100 and then etching the epitaxial layer.

Figure 4:
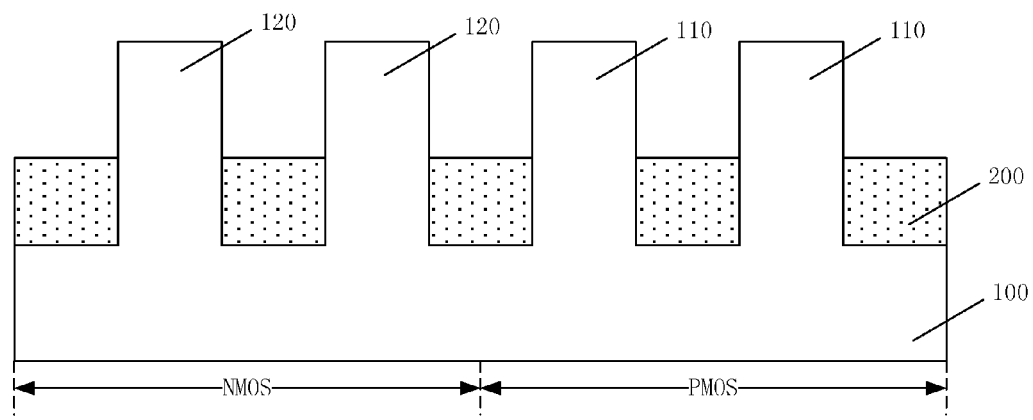

In Step S103 of FIG. 15 and referring to FIG. 4, a first dielectric layer 200 is formed on the semiconductor substrate 100. A surface or top surface of the first dielectric layer 200 can be lower than a top surface of both of the first fin 110 and the second fin 120.

The first dielectric layer 200 can be made of a material including an insulating dielectric material, e.g., silicon oxide, silicon oxynitride, and/or silicon oxycarbide. A method for forming the first dielectric layer 200 can include the following exemplary process. A first dielectric material can be deposited on the surface of the semiconductor substrate 100, such that the first dielectric material can cover the first fin 110 and the second fin 120. The first dielectric material can be planarized using the surface of the first fin 110 and the second fin 120 as a stop layer, to form a first dielectric material layer. A surface of the first dielectric material layer can be leveled with the surface of the first fin 110 and the second fin 120. The first dielectric material layer can be etched back, such that the surface of the first dielectric material layer can be lower than the top surface of both of the first fin 110 and the second fin 120, to form the first dielectric layer 200.

The first dielectric layer 200 can serve as an isolation structure between adjacent first fins 110 and second fins 120. The first dielectric layer 200 can further serve as an isolation structure between a subsequently-formed gate structure and the semiconductor substrate 100.

Figure 5:
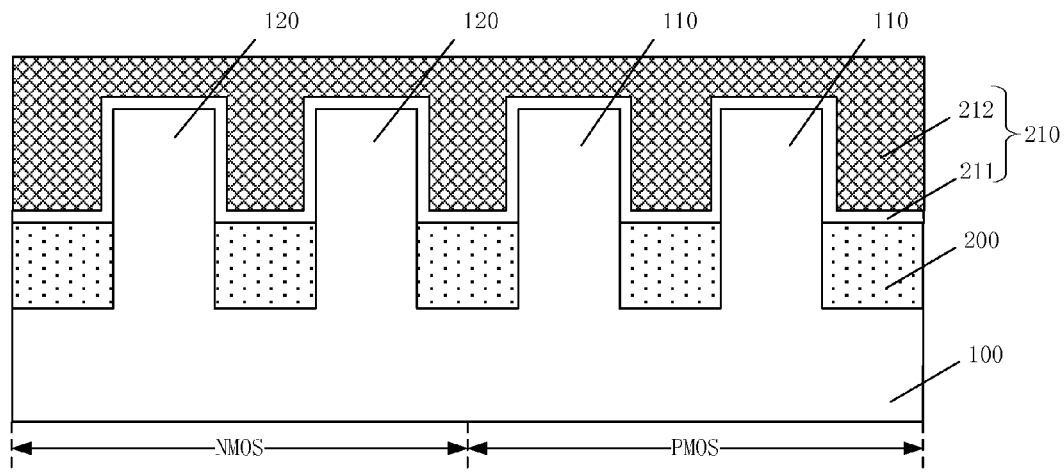

In Step S104 of FIG. 15 and referring to FIG. 5, a gate structure 210 extending across or covering across the first fin 110 and the second fin 120 is formed on the surface of the first dielectric layer 200.

In certain embodiments, the portion of the first fin 110 covered by the gate structure 210 can be referred to as the first portion of the first fin 110. The portion of the first fin 110 not covered by the gate structure 210 (i.e., the portion of the first fin 110 at both sides of the gate structure 210) can be referred to as the second portion of the first fin 110. The portion of second fin 120 covered by the gate structure 210 can be referred to as the first portion of the second fin 120. The portion of the second fin 120 not covered by the gate structure 210 (i.e., the portion of the second fin 120 at both sides of the gate structure 210) can be referred to as the second portion of the second fin 120.

The gate structure 210 can include a gate dielectric layer 211 located on the surface of each of the first dielectric layer 200, the first fin 110 and the second fin 120. The gate structure 210 can further include a gate electrode 212 located on the surface of the gate dielectric layer 211.

The gate dielectric layer 211 can be made of a material including $SiO_2$, $HfO_2$, $La_2O_3$, HfSiON, $HfAlO_2$, $ZrO_2$, $Al_2O_3$, $HfSiO_4$, or a combination thereof. The gate electrode 212 can be made of a material including polysilicon, Al, Cu, Ag, Au, Pt, Ni, Ti, TiN, TaN, Ta, TaC, TaSiN, W, WN, WSi, or a combination thereof.

After forming the gate structure 210, sidewall spacers can be formed on both sides of the gate structure 210 to protect the gate structure 210.

Figure 6:
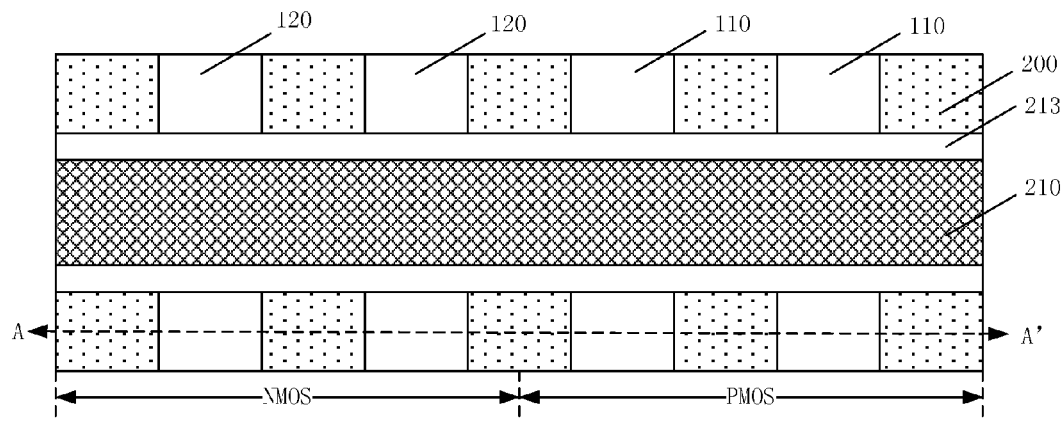

FIG. 6 depicts a top view of the structure after the gate structure 210 is formed. As shown in FIG. 6, sidewall spacers 213 can be located on the both sides of the gate structure 210, in order to protect the gate structure 210 in subsequent processes.

As also shown in FIG. 6, portions of both the first fin 110 and the second fin 120 that are on both sides of the gate structure 210 but not covered by the gate structure 210, can serve as regions for subsequently forming a source and a drain.

Figure 7:
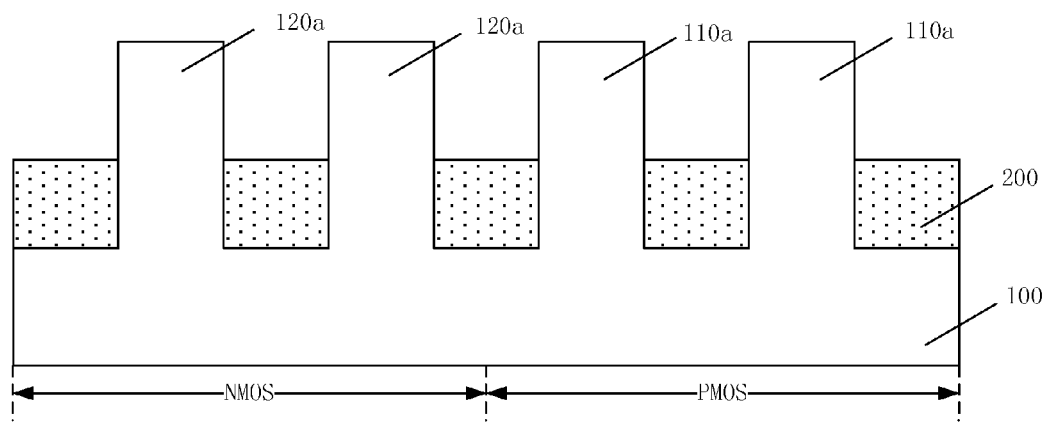

FIG. 7 depicts a cross-sectional view of the structure in FIG. 6 along an intersecting line AA'. The first fin 110a and the second fin 120a as shown in FIG. 7 are, respectively, the portion of the first fin 110 and the portion of the second fin 120 (referring to FIG. 6) that are on each side of the gate structure 210 (referring to FIG. 6) and not covered by the gate structure 210.

Figure 8:
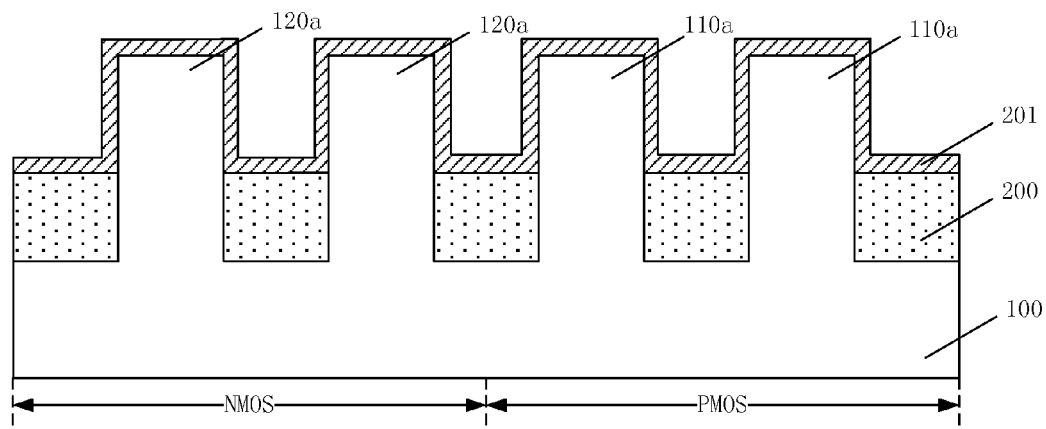

In Step S105 of FIG. 15 and referring to FIG. 8, an etch stop layer 201 covering the surface of the first fin 110a, of the second fin 120a and of the gate structure 210 is formed on the surface of the dielectric layer, i.e., the first dielectric layer 200.

The etch stop layer 201 can be formed using a chemical vapor deposition (CVD) process. The etching stop layer 201 can be used as an etch stop layer when a through hole that connects the gate structure 210 (referring to FIG. 6) to the source or the drain is subsequently formed, in order to protect the surface of the gate structure 210. In one example, the etch stop layer 201 can be made of a material including silicon nitride.

Before or after the etch stop layer 201 is formed, light-doping ion implantation, medium-doping ion implantation, and/or heavy-doping ion implantation can be performed on the second fin(s) 120a (i.e., the second portion of the second fin 120a) on both sides of the gate structure 210 in the NMOS region. The type of ions doped by the light-doping ion implantation and/or heavy-doping ion implantation can include N-type ions, e.g., P, As, Sb, or a combination thereof. The light-doping ion implantation and/or heavy-doping ion implantation can introduce a tensile stress into an implanted region of the second fin 120a, such that mobility of electron charge carriers in the second fin 120a can be increased. The tensile stress generated by the ion implantation process does not improve mobility of hole charge carriers in a P-type FinFET that is to be formed on the PMOS region. Therefore, the light-doping ion implantation and/or heavy-doping ion implantation does not need to be performed within the first fin 110.

In other embodiments of the present disclosure, the etch stop layer is not formed at this stage. In this case, the etch stop layer can be formed after the source and the drain are subsequently formed.

Figure 9:
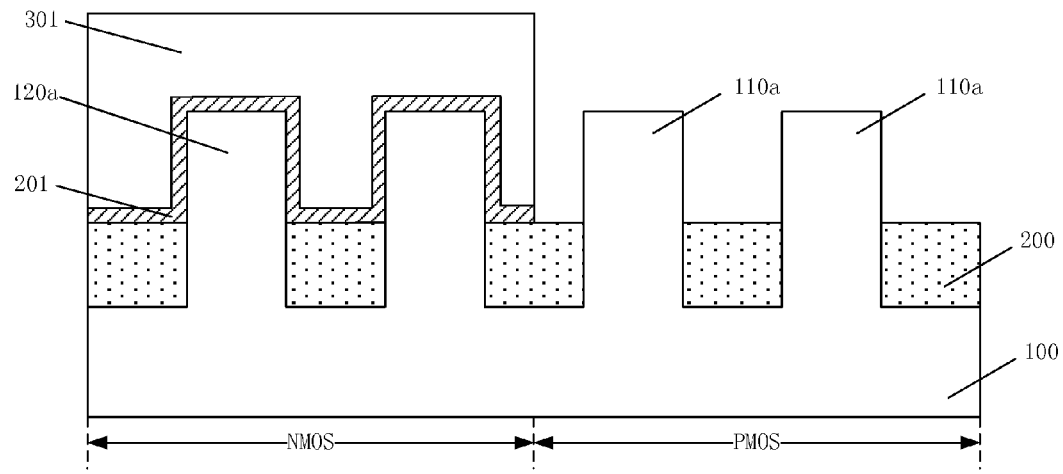

In Step S106 of FIG. 15 and referring to FIG. 9, a first mask layer 301 is formed on the NMOS region. By using the first mask layer 301 as an etch mask, a portion of the etch stop layer 201 (referring to FIG. 8) on the surface of the first fin 110a on both sides of the gate structure 210 (referring to FIG. 6) on the PMOS region can be removed, and a portion of the etch stop layer 201 (referring to FIG. 8) on the surface of the first dielectric layer 200 on the PMOS region can be removed.

The first mask layer 301 can further cover the gate structure 210 on the PMOS region, in order to protect the etch stop layer 201 on the surface of the gate structure 210 on the PMOS region.

In one example, the portion of the etch stop layer 201 on the first fin 110a on both sides of the gate structure 210 (on the PMOS region) and the portion of the etch stop layer 201 on the dielectric layer 200 (on the PMOS region) can be removed using a wet etching process, to expose the top surface and the sidewalls of the first fin 110a above the first dielectric layer 200.

Figure 10:
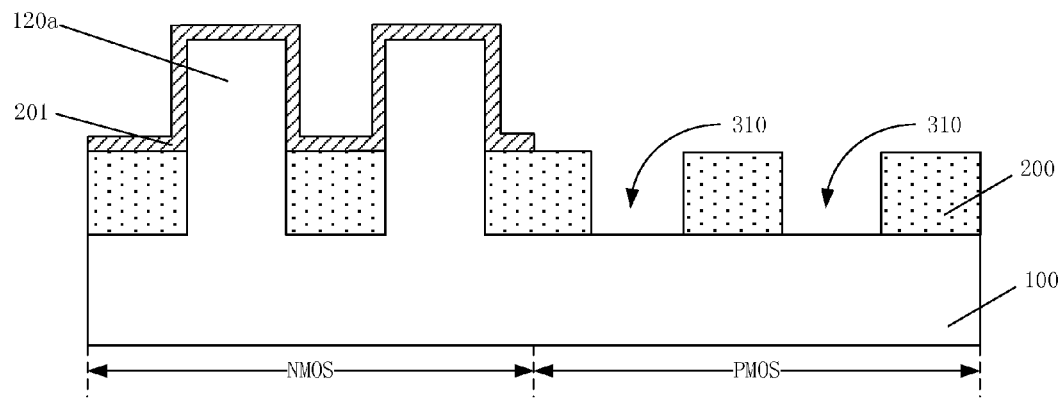

In Step S107 of FIG. 15 and referring to FIG. 10, after the first mask layer 301 (referring to FIG. 9) is removed, the first fin(s) 110a on both sides of the gate structure 210 is removed by using the remaining etch stop layer 201 as an etch mask, to form first recess(es) 310 on the PMOS region.

In one example, the first fin 110a on both sides of the gate structure 210 can be removed using a wet etching process or a dry etching process. In one embodiment, the first fin 110a can be removed using a dry etching process to form the first recess 310.

In other embodiments of the present disclosure, the first mask layer 301 (referring to FIG. 9) on the NMOS region can be retained. The first fin 110a can be removed using the first mask layer 301 as an etch mask. Then, after the first fin 110a is removed, the first mask layer 301 can be removed.

Figure 11:
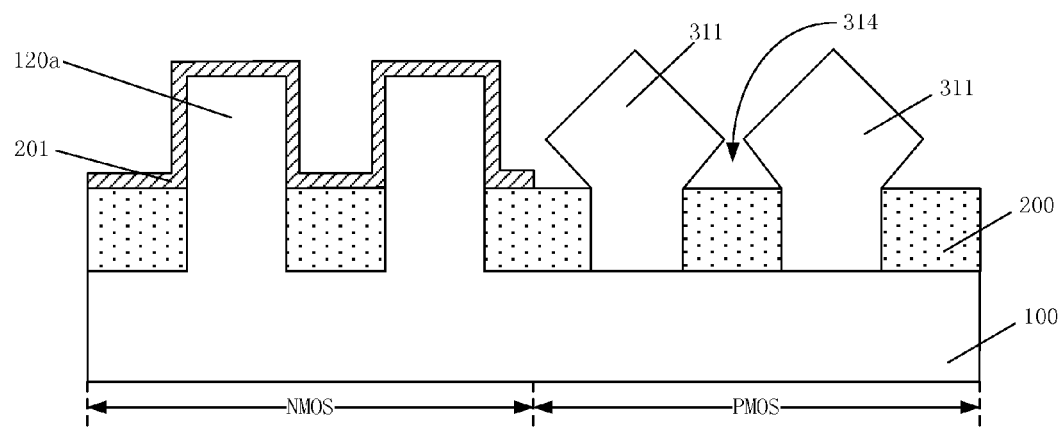

In Step S108 of FIG. 15 and referring to FIG. 11, first semiconductor layer(s) 311a are formed in the first recess(es) 310 (referring to FIG. 10). Further, a top of the first semiconductor layer 311 can be higher than the surface of the first dielectric layer 200. The first semiconductor layer 311 can have a compressive stress.

The first semiconductor layer 311 can fill up the first recess 310. A portion of sidewalls of the first semiconductor layer 311 and a top surface of the first semiconductor layer 311 can be exposed.

The first semiconductor layer 311 can be made of a material including silicon germanium, and can have a compressive stress. The first semiconductor layer 311 can generate a compressive stress on the first fin 110 underneath the gate structure 210 that can be used as a channel region, such that mobility of hole charge carriers in a P-type FinFET formed on the PMOS region can be improved. Thus, performance of the P-type FinFET can be improved.

The first semiconductor layer 311 can be formed using a selective epitaxial process. For example, the selective epitaxial process for forming the first semiconductor layer 311 can have a reaction temperature ranging from about 600° C. to about 1100° C., a pressure ranging from about 1 Torr to about 500 Torr, a silicon source gas of $SiH_4$ or $SiH_2Cl_2$, a germanium source gas of $GeH_4$, and can further have an HCl gas and $H_2$. Each of the silicon source gas, the germanium source gas and the HCl can have a flow rate ranging from about 1 sccm to about 1000 sccm. $H_2$ can have a flow rate ranging from about 0.1 slm to about 50 slm.

Because the first semiconductor layer 311 is formed using an epitaxial process, the first semiconductor layer 311 can grow based on crystal lattice of the surface of the semiconductor substrate 100 at the bottom of the first recess 310. Accordingly, the first recess 310 can have a limiting effect on growth direction of the first semiconductor layer 311. Therefore, with continuous growth of the first semiconductor layer 311, the first recess 310 can be gradually filled.

During continued growth of the first semiconductor layer 311, the first semiconductor layer 311 can gradually become higher than the surface of the first dielectric layer 200. Because there is no limiting effect on the growth of the first semiconductor layer 311 above or higher than the first dielectric layer 200, and the material of the first semiconductor layer 311 can have different growth rates in different crystal directions, the first semiconductor layer 311 above the first dielectric layer 200 can have an octahedron or regular octahedron shape or any other suitable shapes.

Further, the portion of the first semiconductor layer 311 above the first dielectric layer 200 can have a bottom width substantially the same as the width of the first recess 310, and can have the greatest width at the middle which can be equal to a length of the diagonal of the octahedron. Thus, second recess(es) 314 can be formed between adjacent first semiconductor layers 311 and on the first dielectric layer 200. In other words, the second recess(es) 314 can be formed between adjacent first semiconductor layers 311 and the first dielectric layer 200. The second recess 314 can have a narrow top and a wide bottom.

During the process of forming the first semiconductor layer 311 using the epitaxial process, a first in-situ doping process can be performed on the first semiconductor layers 311. The first in-situ doping can have dopant ions that are P-type ions including, e.g., B, Ga, In, or a combination thereof. The P-type ions can have a doping concentration ranging from about $1E17$ atom/cm$^3$ to about $1E20$ atom/cm$^3$. Thus, the first semiconductor layer 311 can be a source region or a drain region of a P-type FinFET formed on the PMOS region. Using the in-situ doping process can prevent defects from forming within the first semiconductor layer 311.

After the first semiconductor layer 311 is formed, the first semiconductor layer 311 can be annealed, in order to eliminate defects generated in the first semiconductor layer 311 during the epitaxial process and activate the P-type dopant ions of the first in-situ doping.

Figure 12:
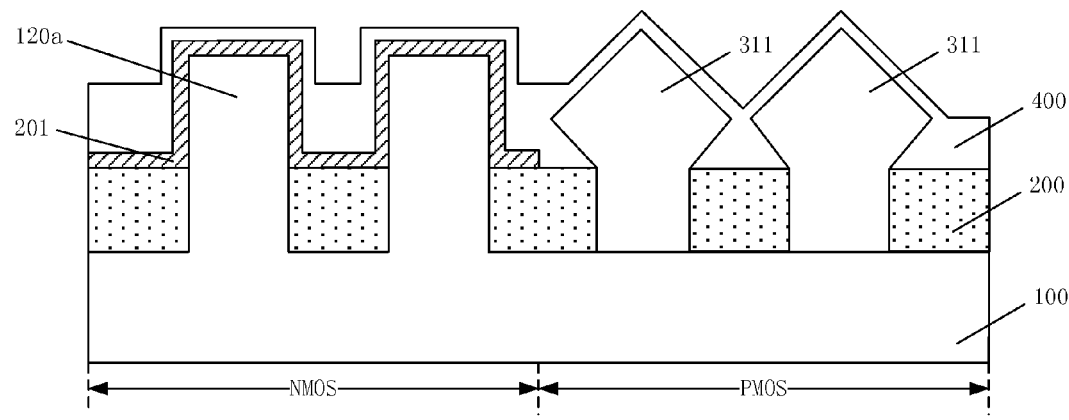

In Step S109 of FIG. 15 and referring to FIG. 12, a second dielectric layer 400 is formed on the surface of the first dielectric layer 200 and on surface of the first semiconductor layer 311 by using a flowable chemical vapor process (or a flowable CVD process).

The flowable CVD process can have a reactant including a flowable dielectric material. In one example, a flowable dielectric material layer can be formed on the first dielectric layer 200 using a spin coating process. The flowable dielectric material layer can be made of a material including at least one of silane, disilane, methyl silane, dimethyl silane, trimethyl silane, tetramethyl silane, tetraethyl orthosilicate (TEOS), triethoxy silane, octamethyl cyclotetrasiloxane, tetramethyl disiloxane, tetramethyl cyclotetrasiloxane, trimethylsilyl amine, and disilyl amine.

Because the flowable dielectric material has a flowability, the flowable dielectric material can sufficiently fill the second recess 314 (referring to FIG. 11) formed between the first dielectric layer 200 and the first semiconductor layer 311, to prevent voids from being formed in the second recess 314. In addition, the flowable dielectric material can have a certain viscosity (or adhesiveness), such that a relatively thin layer of a flowable dielectric material layer can be adhered to the top surface of the etch stop layer 201 and the surface of the first semiconductor layer 311.

In contrast, during the process of filling the second recess 314 having a narrow top and a wide bottom, certain other CVD processes may form voids within the second recess 314 and thus affect isolation effect between adjacent transistors.

After the flowable dielectric material layer is formed, the flowable dielectric material layer can be annealed, to form the second dielectric layer 400. The annealing can be performed under or in one or more gases including $O_2$, $O_3$, NO, $H_2O$ vapor, $N_2$, He, and/or Ar. That is, the annealing can be performed in a gas including one or more of $O_2$, $O_3$, NO, $H_2O$ vapor, $N_2$, He, and Ar. The one or more gases can include at least an oxygen-containing gas. The annealing can have an annealing temperature ranging from about 200° C. to about 1200° C., and a pressure ranging from about 0.1 T to about 100 T.

During the annealing process, oxygen element can form Si—O—Si bonds with the flowable dielectric material to replace chemical bonds, e.g., —Si—H—, —Si—N—, —Si—H—N— and the like, to form the second dielectric layer 400. The annealing treatment can cause the flowable dielectric material layer, previously having the flowability and the viscosity, to cure and form the second dielectric layer 400. The second dielectric layer 400 can be located on the surface of the first dielectric layer 200, substantially fill the second recess 314 formed between the first semiconductor layer 311 and the first dielectric layer 200, and cover the surface of the etch stop layer 201. The annealing treatment can cause structure of the dielectric material within the second dielectric layer 400 to become tighter or denser, remove a portion of impurities (e.g., N and H) in the dielectric material, repair defects within the second dielectric layer 400, and thus improve the isolation effect.

In other embodiments of the present disclosure, a thermal oxidation process or a wet oxidation process may be performed first on the flowable dielectric material layer, such that the flowable dielectric material layer can be first transformed into silicon oxide or silicon oxynitride. Then, the annealing treatment can be performed. In that case, the gas of the annealing process does not need to contain oxygen atoms. The annealing process can repair structural defects within the second dielectric layer 400, improve strength of Si—O—Si bonds, remove remaining chemical bonds that have a relatively weak chemical bond strength, e.g., —Si—H—, —Si— N—, —Si—H—N— and the like, and reduce impurities within the second dielectric layer 400.

The second dielectric layer 400 on the first dielectric layer 200 can have a vertical thickness ranging from about 1/3 to about 3/4 of the thickness of the first fin 110a or the second fin 120a, in order to sufficiently (or substantially completely) fill the second recess 314. For example, the second dielectric layer 400 made by the flowable CVD film can be deposited at 2/3 height from a bottom surface of the entire fin height.

Figure 13:
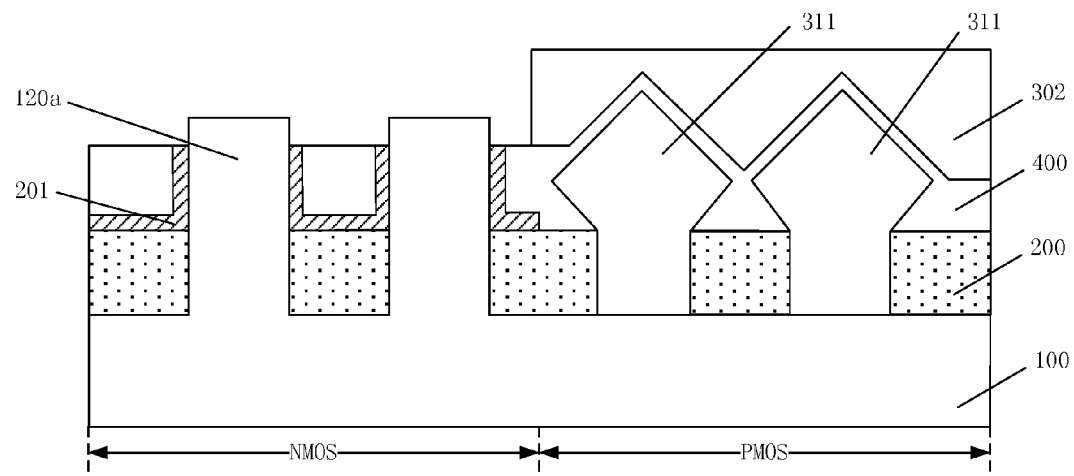

In Step S110 of FIG. 15 and referring to FIG. 13, a second mask layer 302 is formed on the PMOS region. The portion of both of the second dielectric layer 400 and the etch stop layer 201 on the top of the second fin 120a can be removed, to expose the top surface of the second fin 120a.

The second mask layer 302 can further cover the gate structure 210 on the PMOS region, to protect the etch stop layer 201 on the surface of the gate structure 210 on the PMOS region.

The etch stop layer 201 on the top surface of the second fin 120a can be removed using a wet etching process, to expose at least the top surface of the second fin 120a above the second dielectric layer 200. In one embodiment, a portion of sidewall(s) of the second fin 120a can also be exposed.

In Step S111 of FIG. 15 and referring to FIG. 14, the second mask layer 302 (referring to FIG. 13) is removed. A second semiconductor layer 312 is formed on the top surface and/or a top portion of the exposed sidewall of the second fin 120a. In certain embodiments, the second semiconductor layer 312 can be formed at least on the (exposed) top surface of the second fin 120a, and can be further formed on a top portion of the exposed sidewall of the second fin 120a.

The second semiconductor layer 312 can have a tensile stress. The second semiconductor layer(s) 312 can be made of a material including silicon and/or silicon carbide.

In one embodiment, the second semiconductor layer 312 can be made of a material including silicon carbide. By using silicon carbide as the second semiconductor layer 312, the second semiconductor layer 312 can, via the underlying second fin 120a, generate a tensile stress on the portion of the second fin 120a that is covered by the gate structure 210 and serves as a channel region. Thus, mobility of electron charge carriers of 120a of the N-type FinFET formed on the NMOS region can be improved, and performance of the N-type FinFET can be improved accordingly.

A silicon carbide epitaxial layer can be formed using a selective epitaxial process on the surface of the second fin 120a, to serve as the second semiconductor layer 312. For example, the selective epitaxial process can have a reaction temperature ranging from about 600° C. to about 1100° C., a pressure ranging from about 1 Torr to about 500 Torr, a silicon source gas of $SiH_4$ or $SiH_2Cl_2$, a carbon source gas of $CH_4$, and can further have an HCl gas and $H_2$. Each of the silicon source gas, the carbon source gas and the HCl can have a flow rate ranging from about 1 sccm to about 1000 sccm. $H_2$ can have a flow rate ranging from about 0.1 slm to about 50 slm.

Because the second semiconductor layer 312 can grow according to the crystal lattice at the surface of the second fin 120a, and because epitaxial rates can be different in different crystalline directions during the epitaxial growth process, the formed second semiconductor layer 312 can have a regular octahedron shape or any other suitable shapes.

Because the second dielectric layer 400 exists on the surface of the first semiconductor layer 311 on the PMOS region, the second semiconductor layer 312 can only be formed on the surface of the second fin 120a, and is not formed on the surface of first semiconductor layer 311. The second dielectric layer 400 can therefore be used as a protection mask.

During the process of forming the second semiconductor layer 312 using the selective epitaxial process, a second in-situ doping process can be used for doping the second semiconductor layer 312 with N-type ions, e.g., ions of P, Ga, As, or a combination thereof. The N-type ions can have a doping concentration ranging from about 1E17 atom/cm$^3$ to about 1E20 atom/cm$^3$. Thus, the second semiconductor layer 312 and the underlying second fin 120a can form a source region or a drain region of an N-type FinFET formed on the NMOS region. Using the in-situ doping process can prevent defects from forming within the second semiconductor layer 312.

The height of the top of the second semiconductor layer 312 can be substantially the same as the height of the first semiconductor layer 311. That is, the top surface of the first semiconductor layer 311 and the top surface of the second semiconductor layer 312 can have substantially the same distance from the top surface of the semiconductor substrate 100. Thus, subsequently, metal plug(s) can substantially simultaneously be formed on the first semiconductor layer 311 and the second semiconductor layer 312. Accordingly, difficulty in forming metal plugs on the first semiconductor layer 311 and the second semiconductor layer 312 can be reduced.

Because the top of the second semiconductor layer 312 and the top of the first semiconductor layer 311 have the same or similar height, the second semiconductor layer 312 is formed at the top of the second fin 120a, and the top of the second fin 120a is higher than the surface of the first dielectric layer 200, the second semiconductor layer 312 can have a thickness smaller than the thickness of the first semiconductor layer 311 above the first dielectric layer 200. That is, the second semiconductor layer 312 having a regular octahedron shape can have an edge length smaller than the edge length of the regular octahedron (of the first semiconductor layer 311) located above the first dielectric layer 200. Thus, an adjacent first semiconductor layer 311 and second semiconductor layer 312 on the NMOS region and the PMOS region can have a distance or spacing there-between that is sufficiently large, in order to prevent leakage or punch-through phenomenon from occurring between the source and the drain of a N-type FinFET and a P-type FinFET.

Further, because the first semiconductor layer 311 can have a width that is sufficiently high, in other embodiments of the present disclosure, first semiconductor layers 311 can be connected to each other. Thus, the compressive stress generated by the first semiconductor layers 311 on the channel region underneath the gate structure 210 can be further improved. The performance of the P-type FinFET(s) can be improved accordingly.

As such, in various embodiments of the present disclosure, after a portion of a first fin on both sides of a gate structure is removed and a first recess is formed, a first semiconductor layer can be formed in the first recess. Further, a second semiconductor layer can be formed on the surface of a second fin on both sides of the gate structure. A second dielectric layer can be formed on a surface of a first dielectric layer using a flowable CVD process, to fill space between adjacent first semiconductor layers. The flowable CVD process can have a relatively high deposition quality, and can prevent voids from being formed in the space between the adjacent first semiconductor layers and affecting isolation effect between the adjacent first semiconductor layers.

The first semiconductor layers can be made of a material including silicon germanium. The second semiconductor layer can be made of a material including silicon carbide. The first semiconductor layers can have a compressive stress and generate a compressive stress on the first fin underneath the gate structure on the PMOS region. Thus, mobility of hole charge carriers in a P-type FinFET can be improved, and the performance of the P-type FinFET can be improved.

The second semiconductor layer can have a tensile stress, and can generate a tensile stress on the second fin underneath the gate structure on the NMOS region. Thus, mobility of electron charge carriers in an N-type FinFET can be improved, and the performance of the N-type FinFET can be improved.

Further, during the process(es) of forming the first semiconductor layer and the second semiconductor layer, in-situ doping process(es) can be used for doping the first semiconductor layer and the second semiconductor layer with P-type ions and N-type ions, respectively. Thus, the first semiconductor layer and the second semiconductor layer can serve as source or drain of a P-type FinFET and source or drain of an N-type FinFET, respectively. Using the in-situ doping process can prevent defects from forming within the first semiconductor layer and the second semiconductor layer, and accordingly improve the performance of the P-type FinFET or the N-type FinFET.

Various embodiments also provide a semiconductor device. The semiconductor device may include one or more FinFET devices or any other suitable devices. Referring to FIG. 14, an exemplary semiconductor device includes a semiconductor substrate 100. The semiconductor substrate 100 has an NMOS region and a PMOS region. The PMOS region of the semiconductor substrate 100 can have one or more first fins 110 formed thereon. The NMOS region of the semiconductor substrate 100 can have one or more second fins 120 formed thereon. The semiconductor substrate 100 can further have a first dielectric layer 200 formed thereon. A surface of the first dielectric layer 200 can be lower than a top surface of both of the first fin 110 and the second fin 120. A gate structure 210 formed on the surface of the first dielectric layer 200 can extend across the first fin 110 and the second fin 120. The first fin 110 and the second fin 120 underneath the gate structure 210 can form the channel regions of the FinFET devices. The first fin 110 can be substantially entirely covered by the gate structure. A portion of the second fin 120 can be exposed at each side of the gate structure.

On the PMOS region of the semiconductor substrate 100 at each side of the gate structure 210, one or more first semiconductor layers 311 are formed. Each first semiconductor layer can be in contact with a first fin 110 underneath the gate structure 210.

When the methods as disclosed in certain embodiments are used, the first semiconductor layer 311 can be formed on the semiconductor substrate 100 at the same position as a previously-removed second portion of a first fin 110 (i.e., the first fin 110 at the side of the gate structure 210 and not covered by the gate structure 210). The portion of the first semiconductor layer 311 that is lower than the top surface of the first dielectric layer 200 can be substantially entirely in contact with the first portion of the first fin 110 (underneath the gate structure 210).

Each of the first semiconductor layers 311 can serve as a source or drain of a P-type FinFET, and can be separated by the first dielectric layer 200. A top of the first semiconductor layer 311 can be higher than the surface of the first dielectric layer 200. The first semiconductor layers 311 can have a compressive stress.

On the NMOS region of the semiconductor substrate 100 at each side of the gate structure 210, one or more second fins 120a exist as the portion of the second fins 120 that is not covered by the gate structure 210. A second semiconductor layer 312 can be formed on the top of each second fin 120a.

Each second fin 120a and the second semiconductor layer 312 formed thereon can serve as a source or drain of an N-type FinFET, and can be separated by the first dielectric layer 200.

Further, the semiconductor device can include a second dielectric layer 400 on the surface of the first dielectric layer 200, substantially filling the space formed between each of the first semiconductor layers 311, the first dielectric layer 200, and the second fins 120a. Further, a relatively thin layer of second dielectric layer 400 can adhere to the surface of the first semiconductor layer 311.

Optionally, the semiconductor device can include an etch stop layer 201 on the first dielectric layer 200 on the NMOS region and on a portion of the sidewall of the second fins 120a that is lower than the second dielectric layer 400.

Further, at each side of the gate structure 210, the first dielectric layer 200 can be located between a first semiconductor layer 311 or second fin 120a and an adjacent first semiconductor layer 311 or an adjacent second fin 120a. That is, the first dielectric layer 200 can be located on the semiconductor substrate 100 at both sides of each first semiconductor layer 311 or each second fin 120a.

Further details of the disclosed semiconductor device are described in the method for forming a FinFET as disclosed in various embodiments, e.g., in FIGS. 2-13.

In addition, although the first semiconductor layer is P-type in the above description, an N-type or any appropriate type of first semiconductor layer can be used. Although the second semiconductor layer is N-type in the above description, a P-type or any appropriate type of second semiconductor layer can be used. Although the second fin is doped with N-type ions in the above description, P-type ions or any appropriate type of ions can be used. Although a P-well is used in the above description, an N-well or any appropriate type of well can be used. Although an N-well is used in the above description, a P-well or any appropriate type of well can be used.

In an exemplary method for forming a FinFET, a semiconductor substrate having an NMOS region and a PMOS region can be provided. One or more first fins can be formed on the PMOS region. One or more second fins can be formed on the NMOS region. A first dielectric layer can be formed on the semiconductor substrate. A surface of the first dielectric layer can be lower than a top surface of both of the first fins and the second fins. A gate structure or a dummy gate can be formed on the first dielectric layer to extend across the first fins and the second fins. An etch stop layer or a chemical etch stop layer (CESL) can be formed on a surface of the gate structure and on the surface of both of the first fins and the second fins, e.g., as shown in FIG. 8.

A first mask layer can be formed on the NMOS region. The first mask layer can be made of a material including a photoresist. By using the first mask layer as an etch mask, a portion of the etch stop layer on the PMOS region can be removed, e.g., as shown in FIG. 9.

After removing the first mask layer, the first fins can be removed, to form first recesses on the PMOS region, e.g., as shown in FIG. 10. First semiconductor layers can be formed in the first recesses using a selective epitaxial process or a selective growth process, e.g., as shown in FIG. 11. The first semiconductor layers can be made of SiGe. During the selective growth process, the first semiconductor layers can be in-situ doped with B. After the first semiconductor layers are formed, the first semiconductor layers can be annealed.

A second dielectric layer can be formed on the surface of the first dielectric layer by using a flowable CVD process, and then be annealed, e.g., as shown in FIG. 12. That is, the second dielectric layer can be made of a flowable CVD film.

A second mask layer can then be formed on the PMOS region. The second mask layer can be made of a material including a photoresist. On the NMOS region, the etch stop layer and the second dielectric layer at the top of the second fins can be removed, e.g., as shown in FIG. 13.

The second mask layer can then be removed. Second semiconductor layers can be formed at the top of the second fins using an epitaxial process. That is, the second semiconductor layers can cap the second fins, e.g., as shown in FIG. 14. In one example, the second semiconductor layers can be made of Si. During the epitaxial process, the second semiconductor layers can be in-situ doped with As, P, Sb, or a combination thereof. The remaining etch stop layer and second dielectric layer can be used as a mask during the forming of the second semiconductor layer, In one embodiment, the remaining etch stop layer and second dielectric layer can be used as a mask during the forming of the second semiconductor layers. The etch stop layer can be made of a material including silicon nitride. The second dielectric layer can be made of a material including silicon oxide.

In one embodiment, the deposited second dielectric layer or the flowable CVD film can have a vertical thickness or height (measured from a bottom surface of the first fins or the second fins) equal to about ⅔ of the height of the first fins or the second fins.

In one embodiment, after forming the etch stop layer, the etch stop layer on the PMOS region can be removed. The first fins can be removed, to form a first recess on the PMOS region. First semiconductor layers can be formed in the first recesses. The first semiconductor layers can be made of SiGe. A second dielectric layer (a flowable CVD film) can be formed on the surface of the first dielectric layer. On the NMOS region, the etch stop layer and the second dielectric layer at the top of the second fins can be removed. Second semiconductor layers can be formed at the top of the second fins using an epitaxial process. The second fins can thus be extended by the second semiconductor layers and doped by ion implantation. The remaining etch stop layer and second dielectric layer can be used as a mask during the forming of the second semiconductor layers.

As used herein, relational terms such as 'first' and 'second' are merely used for differentiate one element or operation from another element or operation, and do not require or imply that any actual relationship or order as such exist between these elements or operations. In addition, the terms "include", "comprise", "contain", or any other variations thereof, are intended to cover a non-exclusive inclusion, such that a process, method, article, or apparatus that includes a series of elements can not only include those elements, but also include other elements not expressly listed, or inherent elements for such a process, method, article, or apparatus. Without further limitation, an element defined by a statement "include one" does not exclude additional identical elements that may be included in the process, method, article, or apparatus that includes the element.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a fin field effect transistor (FinFET), comprising:
providing a semiconductor substrate having an NMOS region and a PMOS region;

forming a first fin on the PMOS region and a second fin on the NMOS region;

forming a first dielectric layer on the semiconductor substrate, a top surface of the first dielectric layer being lower than a top surface of both of the first fin and the second fin;

forming a gate structure on the first dielectric layer and covering across a first portion of each of the first fin and the second fin;

removing a second portion of the first fin uncovered by the gate structure from the PMOS region, to form a first recess in the first dielectric layer on the semiconductor substrate of the PMOS region;

forming a first semiconductor layer in the first recess in the first dielectric layer on the semiconductor substrate of the PMOS region;

forming a second dielectric layer on the first dielectric layer, on the second fin uncovered by the gate structure, and on the first semiconductor layer on the semiconductor substrate of the PMOS region;

removing a portion of the second dielectric layer to expose at least a top surface of the second fin uncovered by the gate structure, wherein a remaining portion of the second dielectric layer is on the first dielectric layer on a surface of the semiconductor substrate in the NMOS region; and forming a second semiconductor layer at least on the exposed top surface of the second fin and above the second dielectric layer.

2. The method according to claim 1, wherein the forming of the second dielectric layer includes:

forming a flowable dielectric material layer on the first dielectric layer by using a flowable chemical vapor deposition (CVD) process, wherein the flowable dielectric material layer covers the second fin and the first semiconductor layer, and fills space between adjacent first semiconductor layers; and annealing the flowable dielectric material layer to form the second dielectric layer, wherein the second dielectric layer covers the second fin and the first semiconductor layer, and fills the space between the adjacent first semiconductor layers.

3. The method according to claim 2, wherein the flowable dielectric material layer is formed using a spin coating process, and is made of a material including at least one of silane, disilane, methyl silane, dimethyl silane, trimethyl silane, tetramethyl silane, tetraethyl orthosilicate (TEOS), triethoxy silane, octamethyl cyclotetrasiloxane, tetramethyl disiloxane, tetramethyl cyclotetrasiloxane, trimethylsilyl amine, and disilyl amine.

4. The method according to claim 3, wherein:

the annealing is performed in a gas including O2, O3, NO, H2O vapor, N2, He, Ar, or a combination thereof; the gas contains at least an oxygen-containing gas; and the second dielectric layer is made of a material including silicon oxide.

5. The method according to claim 4, wherein the annealing has an annealing temperature ranging from about 200° C. to about 1200° C.

6. The method according to claim 1, wherein:

the first semiconductor layer has a surface higher than the top surface of the first dielectric layer; and the first semiconductor layer is formed using a selective epitaxial process and has a compressive stress.

7. The method according to claim 6, wherein the first semiconductor layer above the first dielectric layer has a cross-section in a regular octahedron shape.

8. The method according to claim 1, wherein the second semiconductor layer is formed using a selective epitaxial process, and has a tensile stress.

9. The method according to claim 8, wherein the second semiconductor layer has a cross-section in a regular octahedron shape.

10. The method according to claim 1, wherein the removing of the second portion of the first fin on the both sides of the gate structure to form the first recess on the PMOS region includes:

forming an etch stop layer on the gate structure, the first fin and the second fin;

forming a first mask layer on the NMOS region;

by using the first mask layer as an etch mask, removing a portion of the etch stop layer on the PMOS region; and after removing the first mask layer, removing the first fin using a wet etching process, to form the first recess on the PMOS region.

11. The method according to claim 1, wherein the exposing of at least the top surface of the second fin includes:

forming a second mask layer on the PMOS region; and by using the second mask layer as an etch mask, removing a portion of the second dielectric layer to expose at least the top surface of the second fin.

12. The method according to claim 1, further including:

during the process of forming the first semiconductor layer, performing a first in-situ doping process on the first semiconductor layer, dopant ions used in the first in-situ doping process including P-type ions.

13. The method according to claim 1, further including:

during the process of forming the second semiconductor layer, performing a second in-situ doping process on the second semiconductor layer, dopant ions used in the second in-situ doping process including N-type ions.

14. The method according to claim 1, further including:

after forming the gate structure, performing light-doping ion implantation and heavy-doping ion implantation in the second fin on the both sides of the gate structure, dopant ions implanted by the light-doping ion implantation and the heavy-doping ion implantation including N-type ions.

15. The method according to claim 1, wherein:

top surface of the first semiconductor layer and a top surface of the second semiconductor layer have substantially a same distance from a top surface of the semiconductor substrate;

the first portion of each of the first fin and the second fin that is underneath the gate structure forms a channel region of a P-type FinFET and an N-type FinFET, respectively;

the first semiconductor layer forms a source or a drain of the P-type FinFET; and the second semiconductor layer and the second fin underneath the second semiconductor layer form a source or a drain of the N-type FinFET.

16. The method according to claim 1, wherein forming the second semiconductor layer further includes:

using the second dielectric layer on the first semiconductor layer on the PMOS region as a protection mask to form the second semiconductor layer on the exposed top surface of the second fin without forming the second semiconductor layer on the first semiconductor layer.

17. The method according to claim 2, wherein the flowable dielectric material layer has a height equal to ⅔ of a height of the first fin or the second fin.

18. The method according to claim 1, wherein the remaining portion of the second dielectric layer is further on the first dielectric layer and the first semiconductor layer, that are on a surface of the semiconductor substrate in the PMOS region.

* * * * *